(12) United States Patent
Yan et al.

(10) Patent No.: US 8,913,413 B2
(45) Date of Patent: *Dec. 16, 2014

(54) MEMORY SYSTEM WITH SECTIONAL DATA LINES

(75) Inventors: Tianhong Yan, San Jose, CA (US); Luca Fasoli, Campbell, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/362,311

(22) Filed: Jan. 31, 2012

(65) Prior Publication Data

US 2012/0170346 A1 Jul. 5, 2012

Related U.S. Application Data

(62) Division of application No. 12/410,648, filed on Mar. 25, 2009, now Pat. No. 8,130,528.

(60) Provisional application No. 61/091,720, filed on Aug. 25, 2008.

(51) Int. Cl.
*G11C 5/02* (2006.01)
*G11C 16/24* (2006.01)
*G11C 13/00* (2006.01)

(52) U.S. Cl.
CPC ............ *G11C 16/24* (2013.01); *G11C 13/0028* (2013.01)
USPC .......................................................... 365/51

(58) Field of Classification Search
None
See application file for complete search history.

(56) References Cited

U.S. PATENT DOCUMENTS

| 3,983,537 A | 9/1976 | Parsons |
| 5,111,071 A | 5/1992 | Kwan |
| 5,159,572 A | 10/1992 | Morton |
| 5,315,541 A | 5/1994 | Harari |
| 5,369,614 A | 11/1994 | Miyanishi |
| 5,589,759 A | 12/1996 | Borgato |
| 5,623,436 A | 4/1997 | Sowards |

(Continued)

FOREIGN PATENT DOCUMENTS

| CN | 1620699 | 5/2005 |
| CN | 1759482 | 4/2006 |

(Continued)

OTHER PUBLICATIONS

Notice of Allowance and Fee(s) Due dated Sep. 25, 2012, U.S. Appl. No. 13/079,613, 20 pages.

(Continued)

*Primary Examiner* — James G Norman
(74) *Attorney, Agent, or Firm* — Vierra Magen Marcus LLP

(57) ABSTRACT

The system includes multiple sets of local data lines in one or more routing metal layers below the three-dimensional memory array and multiple sets of global data lines in one or more top metal layers above the three-dimensional memory array. Each set of one or more blocks include one set of the local data lines. Each bay includes one set of global data lines that connect to the group of sense amplifiers associated with the blocks of the respective bay. Each block includes a subset of first selection circuits for selectively coupling a subset of array lines of the first type to respective local data lines. Each block includes a subset of second selection circuits for selectively coupling a subset of the respective local data lines to global data lines associated with a respective bay.

20 Claims, 12 Drawing Sheets

(56) References Cited

U.S. PATENT DOCUMENTS

| | | |
|---|---|---|
| 5,712,815 A | 1/1998 | Bill |
| 5,742,787 A | 4/1998 | Talreja |
| 5,812,457 A | 9/1998 | Arase |
| 5,835,396 A | 11/1998 | Zhang |
| 5,841,696 A | 11/1998 | Chen |
| 5,847,998 A | 12/1998 | Van Buskirk |
| 5,894,437 A | 4/1999 | Pellegrini |
| 5,912,839 A | 6/1999 | Ovshinsky |
| 5,915,167 A | 6/1999 | Leedy |
| 5,963,465 A | 10/1999 | Eitan |
| 6,034,882 A | 3/2000 | Johnson |
| 6,091,633 A | 7/2000 | Cernea |
| 6,094,374 A | 7/2000 | Sudo |
| 6,141,241 A | 10/2000 | Ovshinsky |
| 6,141,253 A | 10/2000 | Lin |
| 6,144,585 A | 11/2000 | Hazama |
| 6,157,560 A * | 12/2000 | Zheng ............... 365/63 |
| 6,214,666 B1 | 4/2001 | Mehta |
| 6,243,290 B1 | 6/2001 | Kurata |
| 6,269,022 B1 | 7/2001 | Ra |
| 6,282,117 B1 | 8/2001 | Tanaka |
| 6,292,048 B1 | 9/2001 | Li |
| 6,301,161 B1 | 10/2001 | Holzmann |
| 6,307,785 B1 | 10/2001 | Takeuchi |
| 6,331,943 B1 | 12/2001 | Naji et al. |
| 6,333,881 B1 | 12/2001 | Kusunoki et al. |
| 6,420,215 B1 | 7/2002 | Knall |
| 6,426,893 B1 | 7/2002 | Conley |
| 6,473,332 B1 | 10/2002 | Ignaliev |
| 6,525,953 B1 | 2/2003 | Johnson |
| 6,529,409 B1 | 3/2003 | Nguyen |
| 6,529,410 B1 | 3/2003 | Han |
| 6,532,172 B2 | 3/2003 | Harari |
| 6,542,428 B2 | 4/2003 | Hidaka |
| 6,563,369 B1 | 5/2003 | Comer |
| 6,567,287 B2 * | 5/2003 | Scheuerlein ............... 365/51 |
| 6,574,145 B2 | 6/2003 | Kleveland |
| 6,614,688 B2 | 9/2003 | Jeong et al. |
| 6,657,889 B1 | 12/2003 | Subramanian |
| 6,735,104 B2 | 5/2004 | Scheuerlein |
| 6,809,462 B2 | 10/2004 | Pelrine |
| 6,839,260 B2 | 1/2005 | Ishii |
| 6,856,541 B2 | 2/2005 | Cernea |
| 6,856,572 B2 | 2/2005 | Scheuerlein |
| 6,871,257 B2 | 3/2005 | Conley |
| 6,879,505 B2 | 4/2005 | Scheuerlein |
| 6,937,510 B2 | 8/2005 | Hosono |
| 6,951,780 B1 | 10/2005 | Herner |
| 6,952,030 B2 | 10/2005 | Herner |
| 6,952,043 B2 | 10/2005 | Vyvoda |
| 7,002,085 B2 | 2/2006 | Ullmann |
| 7,042,765 B2 | 5/2006 | Sibigtroth |
| 7,068,538 B2 | 6/2006 | Devin |
| 7,068,539 B2 | 6/2006 | Guterman |
| 7,081,377 B2 | 7/2006 | Cleeves |
| 7,126,841 B2 | 10/2006 | Rinerson |
| 7,286,439 B2 | 10/2007 | Fasoli |
| 7,301,839 B2 | 11/2007 | Li |
| 7,307,884 B2 | 12/2007 | Guterman |
| 7,359,279 B2 | 4/2008 | Fasoli |
| 7,362,604 B2 | 4/2008 | Scheuerlein |
| 7,369,428 B2 | 5/2008 | Jeong |
| 7,391,638 B2 | 6/2008 | Fasoli |
| 7,420,850 B2 | 9/2008 | Fasoli |
| 7,447,075 B2 | 11/2008 | Guterman |
| 7,453,730 B2 | 11/2008 | Guterman |
| 7,812,404 B2 | 10/2010 | Herner et al. |
| 7,869,258 B2 | 1/2011 | Scheuerlein |
| 7,885,102 B2 | 2/2011 | Hanzawa et al. |
| 7,920,408 B2 | 4/2011 | Azuma et al. |
| 7,978,507 B2 | 7/2011 | Scheuerlein |
| 8,027,209 B2 | 9/2011 | Yan et al. |
| 8,098,511 B2 | 1/2012 | Scheuerlein et al. |
| 8,111,539 B2 | 2/2012 | Fasoli et al. |
| 8,130,528 B2 | 3/2012 | Yan |
| 8,237,143 B2 | 8/2012 | Toda |
| 8,270,210 B2 | 9/2012 | Scheuerlein |
| 8,279,650 B2 | 10/2012 | Yan et al. |
| 2002/0057594 A1 * | 5/2002 | Hirai ............... 365/171 |
| 2002/0057598 A1 | 5/2002 | Sakamoto |
| 2002/0071312 A1 | 6/2002 | Tanaka |
| 2003/0117831 A1 | 6/2003 | Hush |
| 2004/0032788 A1 | 2/2004 | Sakui |
| 2004/0036103 A1 | 2/2004 | Chen |
| 2004/0124466 A1 | 7/2004 | Walker et al. |
| 2004/0160798 A1 | 8/2004 | Rinerson |
| 2004/0188714 A1 * | 9/2004 | Scheuerlein et al. ......... 257/200 |
| 2004/0202028 A1 | 10/2004 | Cioaca |
| 2005/0162898 A1 | 7/2005 | Nejad |
| 2005/0162908 A1 | 7/2005 | Kato |
| 2006/0062043 A1 | 3/2006 | Roehr |
| 2006/0133145 A1 | 6/2006 | Park et al. |
| 2006/0146608 A1 | 7/2006 | Fasoli et al. |
| 2006/0146639 A1 | 7/2006 | Fasoli |
| 2006/0157679 A1 | 7/2006 | Scheuerlein |
| 2006/0197115 A1 | 9/2006 | Toda |
| 2006/0250836 A1 | 11/2006 | Herner |
| 2006/0291291 A1 | 12/2006 | Hosono et al. |
| 2007/0002610 A1 | 1/2007 | Knall |
| 2007/0008773 A1 | 1/2007 | Scheuerlein |
| 2007/0076479 A1 | 4/2007 | Kim et al. |
| 2007/0091680 A1 | 4/2007 | Conley |
| 2007/0104002 A1 * | 5/2007 | Edahiro ............... 365/203 |
| 2007/0109850 A1 | 5/2007 | Li et al. |
| 2007/0190722 A1 | 8/2007 | Herner |
| 2007/0263423 A1 | 11/2007 | Scheuerlein |
| 2007/0285971 A1 | 12/2007 | Toda et al. |
| 2008/0025061 A1 | 1/2008 | Scheuerlein |
| 2008/0025132 A1 | 1/2008 | Fasoli |
| 2008/0062739 A1 | 3/2008 | Bill et al. |
| 2008/0062740 A1 | 3/2008 | Baek |
| 2008/0094892 A1 | 4/2008 | Fasoli |
| 2008/0151601 A1 | 6/2008 | Kang |
| 2008/0151637 A1 | 6/2008 | Doyle |
| 2008/0291737 A1 | 11/2008 | Moon et al. |
| 2008/0316798 A1 | 12/2008 | Tanizaki |
| 2009/0116280 A1 | 5/2009 | Parkinson |
| 2009/0213639 A1 | 8/2009 | Toda |
| 2009/0296443 A1 | 12/2009 | Gajapathy |
| 2009/0323392 A1 | 12/2009 | Fasoli |
| 2009/0323393 A1 | 12/2009 | Scheuerlein |
| 2010/0046267 A1 | 2/2010 | Yan |
| 2010/0046273 A1 | 2/2010 | Azuma et al. |
| 2010/0085822 A1 | 4/2010 | Yan |
| 2010/0214828 A1 | 8/2010 | Hanzawa et al. |
| 2010/0265750 A1 | 10/2010 | Yan |
| 2011/0075468 A1 | 3/2011 | Scheuerlein |
| 2011/0182105 A1 | 7/2011 | Yan |
| 2012/0170347 A1 | 7/2012 | Yan et al. |

FOREIGN PATENT DOCUMENTS

| | | |
|---|---|---|
| CN | 101189679 | 5/2008 |
| EP | 1282134 | 2/2003 |
| EP | 1308960 | 7/2003 |
| EP | 1426969 | 6/2004 |
| GB | 2434901 | 8/2007 |
| JP | 2001274355 | 10/2001 |
| JP | 2006514440 | 4/2006 |
| JP | 2008541452 | 11/2008 |
| WO | WO9808225 | 2/1998 |
| WO | 2006121837 | 11/2006 |
| WO | 2008030351 | 3/2008 |
| WO | 2008032394 | 3/2008 |
| WO | 2009001534 | 12/2008 |

OTHER PUBLICATIONS

Office Action dated Sep. 26, 2012, U.S. Appl. No. 13/362,320, 39 pages.
Response to Office Action datd Jul. 16, 2012, U.S. Appl. No. 13/079,613, filed Apr. 4, 2011, 15 pages.
PCT International Search Report dated Sep. 29, 2009, PCT Appl. PCT/US2009/050970.

(56) References Cited

OTHER PUBLICATIONS

Written Opinion of the International Searching Authority, dated Sep. 29, 2009, PCT Appl. PCT/US2009/050970.
Response to the Written Opinion dated May 16, 2011, European Patent Application No. 09790573.1.
Office Action dated Oct. 7, 2010, U.S. Appl. No. 12/410,648.
Response to Office Action dated Nov. 5, 2010, U.S. Appl. No. 12/410,648.
Office Action dated Jan. 18, 2011, U.S. Appl. No. 12/410,648.
Response to Office Action dated Apr. 1, 2011, U.S. Appl. No. 12/410,648.
Office Action dated Jun. 28, 2011, U.S. Appl. No. 12/410,648.
Response to Office Action dated Oct. 17, 2011, U.S. Appl. No. 12/410,648.
Notice of Allowance dated Nov. 3, 2011, U.S. Appl. No. 12/410,648.
Office Action dated Mar. 14, 2012, U.S. Appl. No. 13/079,613.
Response to Office Action filed Feb. 26, 2013, U.S. Appl. No. 13/362,320, 8 pages.
Notification of Reasons for Rejection dated Feb. 26, 2013 in Japanese Patent Application No. 2011-525038, 15 pages.
Response to Office Action dated Aug. 15, 2013 in U.S. Appl. No. 13/362,320, 9 pages.
Response to Office Action filed Aug. 2, 2013 in Chinese Patent Application No. 200980133212.4, 16 pages.
Office Action dated Jul. 19, 2013 in Taiwanese Patent Application No. 098126194, 15 pages.
Response to Office Action filed Oct. 18, 2013 in Taiwanese Patent Application No. 098126194, 4 pages.
English Translation of Replacement Claims filed in the Response to Office Action filed Oct. 18, 2013 in Taiwanese Patent Application No. 098126194, 9 pages.
International Search Report dated Dec. 4, 2009 in PCT Application No. PCT/US2009/058889.
Written Opinion of the International Searching Authority dated Dec. 4, 2009 in PCT Application No. PCT/US2009/058889.
U.S. Appl. No. 12/563,139, filed Sep. 20, 2009.
U.S. Appl. No. 13/479,145, filed May 23, 2012.
U.S. Appl. No. 13/601,869, filed Aug. 31, 2012.
Office Action dated Sep. 14, 2011, U.S. Appl. No. 12/563,139.
Response to Office Action dated Jan. 11, 2012, U.S. Appl. No. 12/563,139.
Office Action dated Mar. 23, 2012, U.S. Appl. No. 12/563,139.
Response to Office Action dated May 18, 2012, U.S. Appl. No. 12/563,139.
Notice of Allowance dated Jun. 4, 2012, U.S. Appl. No. 12/563,139.
Office Action dated Feb. 28, 2013, U.S. Appl. No. 13/479,145.
Response to Office Action dated Jun. 27, 2013, U.S. Appl. No. 13/479,145.
Notice of Allowance dated Sep. 17, 2013, U.S. Appl. No. 13/479,145.
Office Action dated Dec. 21, 2013, U.S. Appl. No. 13/601,869.
Response to Office Action dated Mar. 22, 2013, U.S. Appl. No. 13/601,869.
Final Office Action dated May 31, 2013, U.S. Appl. No. 13/601,869.
European Response to Written Opinion dated Jun. 8, 2012, European Patent Application No. 09793151.3.
U.S. Appl. No. 12/563,140, filed Sep. 20, 2009.
Office Action dated Feb. 23, 2011, U.S. Appl. No. 12/563,140, filed Sep. 20, 2009.
Response to Office Action dated May 16, 2012, U.S. Appl. No. 12/563,140, filed Sep. 20, 2009.
Notice of Allowance dated May 27, 2011, U.S. Appl. No. 12/563,140, filed Sep. 20, 2009.
International Search Report dated Dec. 8, 2009 in PCT Application No. PCT/US2009/058890.
Written Opinion of the International Searching Authority dated Dec. 8, 2009 in PCT Application No. PCT/US2009/058890.
Response to the Written Opinion dated Nov. 28, 2011, EP Patent Application No. 09737244.5.
First Office Action dated May 24, 2013 in Chinese Patent Application No. 200980139725.6, 17 pages.
Response to Office Action dated Oct. 8, 2013 in Chinese Patent Application No. 200980139725.6.
English Translation of Amended Claims filed in the Response to Office Action dated Oct. 8, 2013 in Chinese Patent Application No. 200980139725.6.
English Abstract for CN1620699 published May 25, 2005.
English Abstract for CN1759482 published Apr. 12, 2006.
English Abstract for CN101189679 published May 28, 2008.
First Office Action dated Jun. 25, 2013 in Japanese Patent Application No. 2011-530151.
Response to Office Action dated Aug. 23, 2013 in Japanese Patent Application No. 2011-530151.
English Translation of Amended Claims filed in the Response to Office Action filed Aug. 23, 2013 in Japanese Patent Application No. 2011-530151.
Final Office Action dated Oct. 29, 2013 in U.S. Appl. No. 13/362,320, 14 pages.
Office Action dated Jan. 10, 2014 in Chinese Patent Application No. 200980133212.4, 5 pages.
Response to Office Action filed Mar. 19, 2014 in Chinese Patent Application No. 200980133212.4 with English translation of amended claims, 30 pages.
Response to Office Action filed Mar. 31, 2014 in U.S. Appl. No. 13/362,320, 7 pages.
Office Action dated Apr. 30, 2014 in U.S. Appl. No. 13/362,320, 16 pages.
Response to Office Action filed Aug. 1, 2014 in U.S. Appl. No. 13/362,320, 10 pages.
Response to Office Action filed Aug. 22, 2014 in Chinese Patent Application No. 2009801332124, with English translation of the Amended Claims, 10 pages.
Office Action dated Sep. 25, 2014 in U.S. Appl. No. 13/362,320, 33 pages.

* cited by examiner

MEMORY SYSTEM WITH SECTIONAL DATA LINES

This application is a divisional application of U.S. patent application Ser. No. 12/410,648, "Memory System with Sectional Data Lines," by Yan, et al., filed on Mar. 25, 2009, which claims the benefit of U.S. Provisional Application No. 61/091,720, "Memory System With Sectional Data Line," by Yan, et al., filed on Aug. 25, 2008, both of which are incorporated herein by reference in their entirety.

CROSS REFERENCE TO RELATED APPLICATION

This application is related to U.S. patent application Ser. No. 13/362,320, "Memory System with Sectional Data Lines," by Yan, et al., filed the same day as the present application, and U.S. patent application Ser. No. 13/079,613, "Memory System with Sectional Data Lines," by Yan, et al., filed on Apr. 4, 2011, both of which are incorporated herein by reference in their entirety.

BACKGROUND

1. Field

The present invention relates to technology for data storage.

2. Description of the Related Art

Recent developments in semiconductor processing technologies and memory cell technologies have continued to increase the density achieved in integrated circuit memory arrays. For example, certain memory arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory Array."

A three-dimensional memory array is most efficient when the number of memory cells on each bit line and word line is large. This number of cells is frequently called the fan-out (N) of the bit line or the word line. A large fan-out reduces the number of vertical connections between the array lines on each memory layer and the circuitry below. These vertical connections cannot lie beneath the individual memory cells on each layer, and thus may add significantly to the chip area. But a large fan-out frequently has certain electrical disadvantages depending on the memory cell technology being used. For example, the capacitance of array lines and the resistance of array lines may increase, and leakage per cell may cause power dissipation to increase. If the resistance on the bit line path is too high, a voltage drop can be experienced. Capacitance on the bit line path will affect sensing speed.

SUMMARY

A sectional data line scheme is disclosed that reduces the capacitance and resistance of the bit line paths.

One embodiment includes a plurality of data storage elements, a plurality of signal lines positioned within the plurality of data storage elements and in communication with the plurality of data storage elements, a plurality of local data lines outside the plurality of data storage elements (different subsets of the local data lines are in selective communication with different subsets of the data storage elements via the signal lines), a plurality of global data lines outside of the plurality of data storage elements and in selective communication with multiple subsets of the local data lines, and control circuitry connected to the global data lines.

One embodiment includes a memory array comprising a plurality of data storage elements, a plurality of signal lines positioned in the memory array and in communication with the storage elements, a plurality of local data lines outside the memory array and in selective communication with the signal lines, a plurality of global data lines outside of the memory array, and control circuitry connected to the global data lines. A first subset of the local data lines are in selective communication with a first subset of the data storage elements and not in communication with other data storage elements. A second subset of the local data lines are in selective communication with a second subset of the data storage elements and not in communication with other data storage elements. The global data lines are in selective communication with the first subset of the local data lines and the second subset of the local data lines.

One embodiment includes a plurality of data storage elements comprising a monolithic three-dimensional memory array, a plurality of bit lines positioned in the memory array and connected to the data storage elements, a plurality of word lines positioned in the memory array and connected to the data storage elements, a plurality of local data lines in at least one metal layer below the memory array, a plurality of global data lines in at least one metal layer above the memory array, a first group of selection circuits to selectively electrically connect the bit lines to the local data lines, a second group of selection circuits to selectively electrically connect the local data lines to the global data lines, word line control circuitry in communication with the word lines, and a plurality of sense amplifiers positioned below the memory array and connected to the global data lines.

One embodiment includes a plurality of non-volatile storage elements arranged in groups, control lines in communication with the non-volatile storage elements, multiple sets of first local data lines such that each group includes its own set of first local data lines, a set of global data lines, first selection circuits such that each group includes a different subset of the first selection circuits for selectively electrically connecting a subset of the control lines to first local data lines for the respective group, second selection circuits such that the second selection circuits selectively electrically connect a subset of the first local data lines for the respective group to the global data lines, and control circuits in communication with the global data lines.

One embodiment includes a method for operating a data storage system, comprising selecting a first bay from a plurality of bays (where the plurality of bays comprise an array of data storage elements and each bay includes a plurality of blocks of data storage elements), selecting a block within the first bay such that the selected block includes multiple columns of selection circuits and each of the selection circuits are connected to a different bit line for the selected block, selecting a column of the selected block and using the selection circuits of the selected column to provide communication between local data lines and bit lines connected to the selection circuits of the selected column, selecting a subset of the local data lines to communicate with a set of global data lines, performing a memory operation (using the global data lines) on data storage elements in communication with the selected subset of local data lines. Bit lines for the selected block are in communication data storage elements. The set of global data lines also connect to local data lines for other blocks.

One embodiment includes a method for operating a data storage system, comprising electrically connecting a set of control lines to a set of local data lines so that the control lines are in communication with the set of local data lines. The control lines are also in communication with a first subset of a plurality of data storage elements. The set of local data lines are positioned outside of the plurality of data storage elements. The method further includes selecting and electrically connecting a subset of the local data lines to a set of global data lines so that the subset of the local data lines are in communication with the set of global data lines. The global data lines are positioned outside of the plurality of data storage elements. The global data lines are connected to control circuitry. The global data lines are also connected to other local data lines. The method further comprises performing a memory operation on at least a portion of the first subset of data storage elements using the control circuitry.

DETAILED DESCRIPTION

A sectional data line scheme is disclosed for a memory array. Local data lines are provided for each section, where a section can include one, two, four, etc. blocks. Selection circuits are used to electrically connect the local data lines to the appropriate bit lines (or in some embodiments word lines or other type of control lines). Sense amplifier (or other control logic) outputs are provided to global data lines across one or all bays. Selections circuits are used to connect the global data lines to the appropriate local data lines.

In one embodiment, the local data lines are implemented in one or more lower metal layers below the memory array. These lower metal layers have a relatively higher resistance and capacitance. The global data lines are implemented in one or more top metal layers, which have relatively lower resistance and lower capacitance than the lower metal layers. By only implementing the shorter local data lines in the lower metal layer(s) and the longer global data lines in the top metal layer(s), the overall resistance and capacitance of the bit line paths are reduced.

Figure 1:
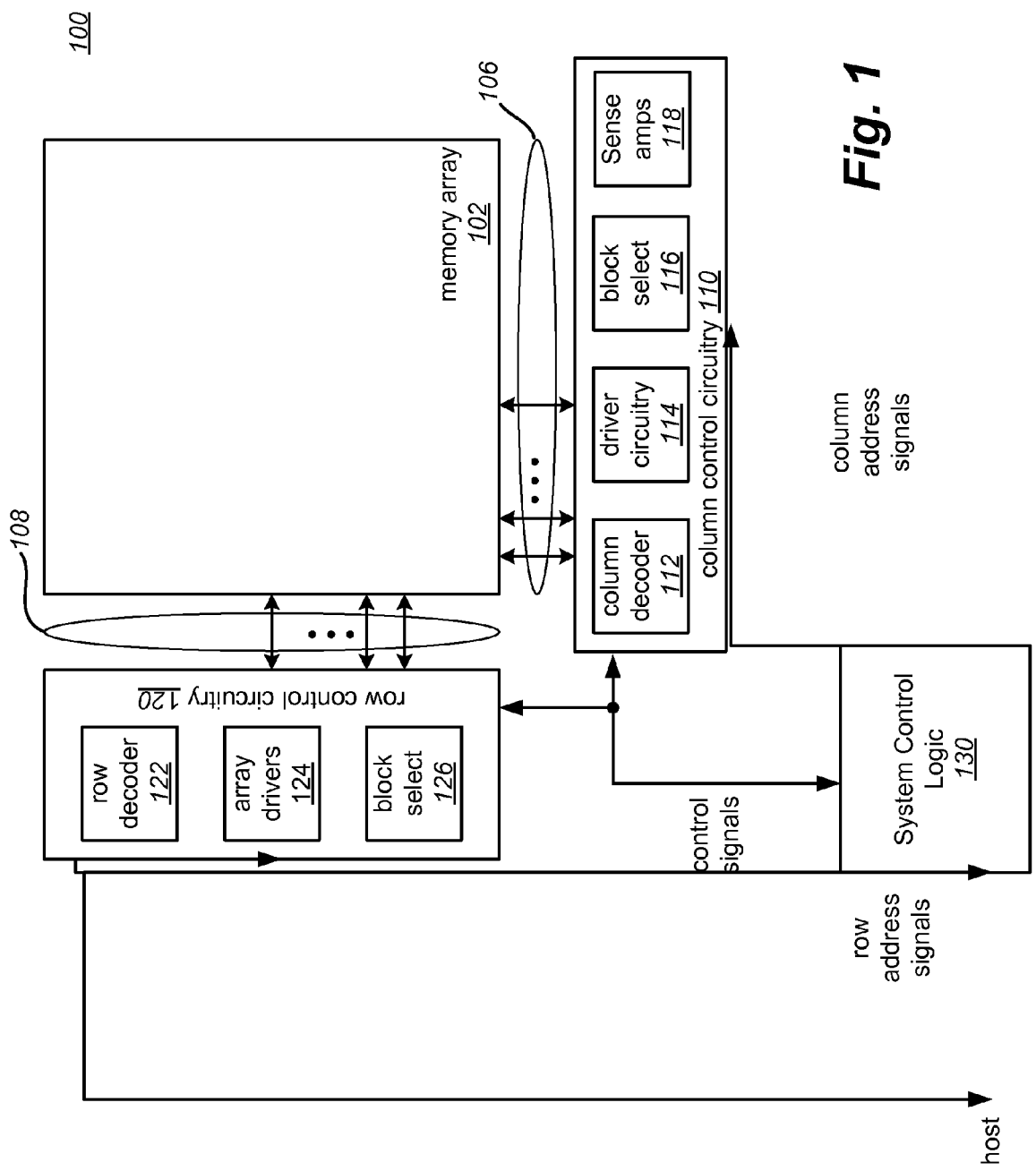
FIG. 1 is a block diagram of one embodiment of a memory system.

FIG. 1 is a block diagram that depicts one example of a memory system 100 that can implement the sectional data line scheme described herein. Memory system 100 includes a memory array 102 that can be a two or three-dimensional array of memory cells. In one embodiment, memory array 102 is a monolithic three-dimensional memory array. The array terminal lines of memory array 302 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. For purposes of this documents a connection can be a direct connection or indirect connection (e.g., via another part). Row control circuitry 108 receives a group of M row address signals and one or more various control signals from System Control Logic circuit 130, and typically may include such circuits as row decoders 122, array terminal drivers 124, and block select circuitry 126 for both read and programming (e.g., SET and RESET) operations.

Memory system 100 also includes column control circuitry 110 whose input/outputs 106 are connected to respective bit lines of the memory array 102. Column control circuitry 106 receives a group of N column address signals and one or more various control signals from System Control Logic 130, and typically may include such circuits as column decoders 112, array terminal receivers or drivers 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from a host and provides output data to the host. In other embodiments, system control logic 130 receives data and commands from a separate controller circuit and provides output data to that controller circuit. The controller circuit communicates with the host. System control logic 130 may include one or more state machines, registers and other control logic for controlling the operation of memory system 100.

In one embodiment, all of the components depicted in FIG. 1 are arranged on a single integrated circuit. For example, system control logic 130, column control circuitry 110 and row control circuitry 120 are formed on the surface of a substrate and memory array 102 is a monolithic three-dimensional memory array formed above the substrate (and, therefore, above system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279.

Figure 2:
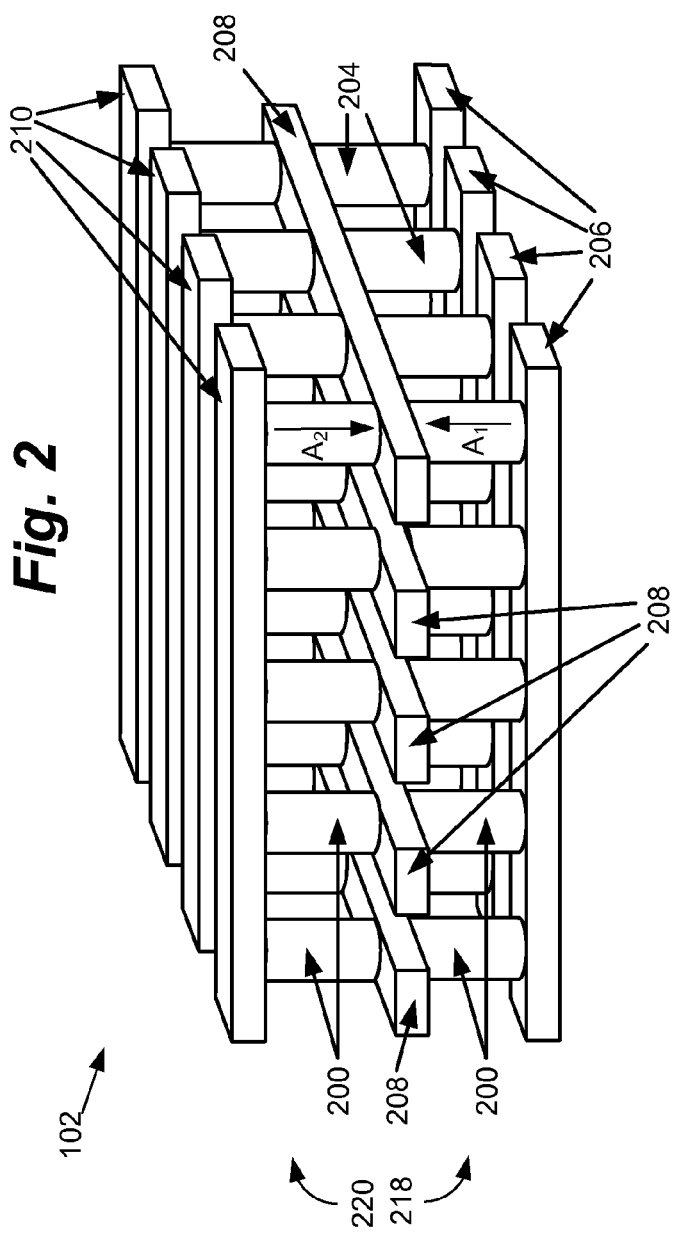
FIG. 2 is a simplified perspective view of a portion of a three-dimensional memory array.

FIG. 2 is a simplified perspective view of a portion of a monolithic three-dimensional array 102 that includes a first memory level 218 positioned below a second memory level 220. In some embodiments, the memory levels may be formed as described in U.S. Pat. No. 6,952,030, "High-Density Three-Dimensional Memory Cell," which is hereby incorporated by reference herein in its entirety. For instance, the upper conductors of first memory level 218 may be used as the lower conductors of the second memory level 220 that is positioned above the first memory level, as shown in FIG. 2.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three-dimensional Structure Memory." The substrates may be thinned or removed from the memory levels before bonding, but as the memory levels are initially formed over separate substrates, such memories are not true monolithic three-dimensional memory arrays.

Memory array 102 includes a plurality of memory cells 200. With respect to first memory level 218, memory cells 200 are between and connect to a set of bit lines 206 and a set of word lines 208. With respect to second memory level 220, memory cells 200 are between and connect to a set of bit lines 210 and word lines 208.

In one embodiment, each memory cell includes a diode (or other steering element) and a resistance element. In such embodiments, the diodes on adjacent memory levels preferably point in opposite directions, as described in U.S. patent application Ser. No. 11/692,151, filed Mar. 27, 2007 and titled "Large Array Of Upward Pointing P-I-N Diodes Having Large And Uniform Current," which is hereby incorporated by reference herein in its entirety. For example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa.

In one embodiment, the memory cells 200 may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistivity-switching element. A reversible resistance-switching element includes reversible resistivity-switching material having a resistivity that may be reversibly switched between two or more states. For example, the reversible resistivity-switching material may be in an initial high-resistivity state upon fabrication that is switchable to a low-resistivity state upon application of a first voltage and/or current. Application of a second voltage and/or current may return the reversible resistivity-switching material to the high-resistivity state. Alternatively, the reversible resistance-switching element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistivity-switching materials and operation of memory cells employing reversible resistance-switching materials are described, for example, in U.S. Patent Application Publication 2006/0250836, incorporated herein by reference in its entirety. In some embodiments, reversible resistance-switching material 230 may be formed from a metal oxide. Various different metal oxides can be used. In one example, nickel oxide is used.

In one embodiment, the process of switching the resistance from the high-resistivity state to the low-resistivity state is referred to as SETTING the reversible resistance-switching element. The process of switching the resistance from the low-resistivity state to the high-resistivity state is referred to as RESETTING the reversible resistance-switching element. The high-resistivity state is associated with binary data "0" and the low-resistivity state is associated with binary data "1." In other embodiments, SETTING and RESETTING and/or the data encoding can be reversed. In some embodiments, the first time a resistance-switching element is SET requires a higher than normal voltage and is referred to as a FORMING operation.

No particular type of memory cell is required for the sectional data line scheme disclosed herein. Many different types of memory cells can be used.

Figure 3:
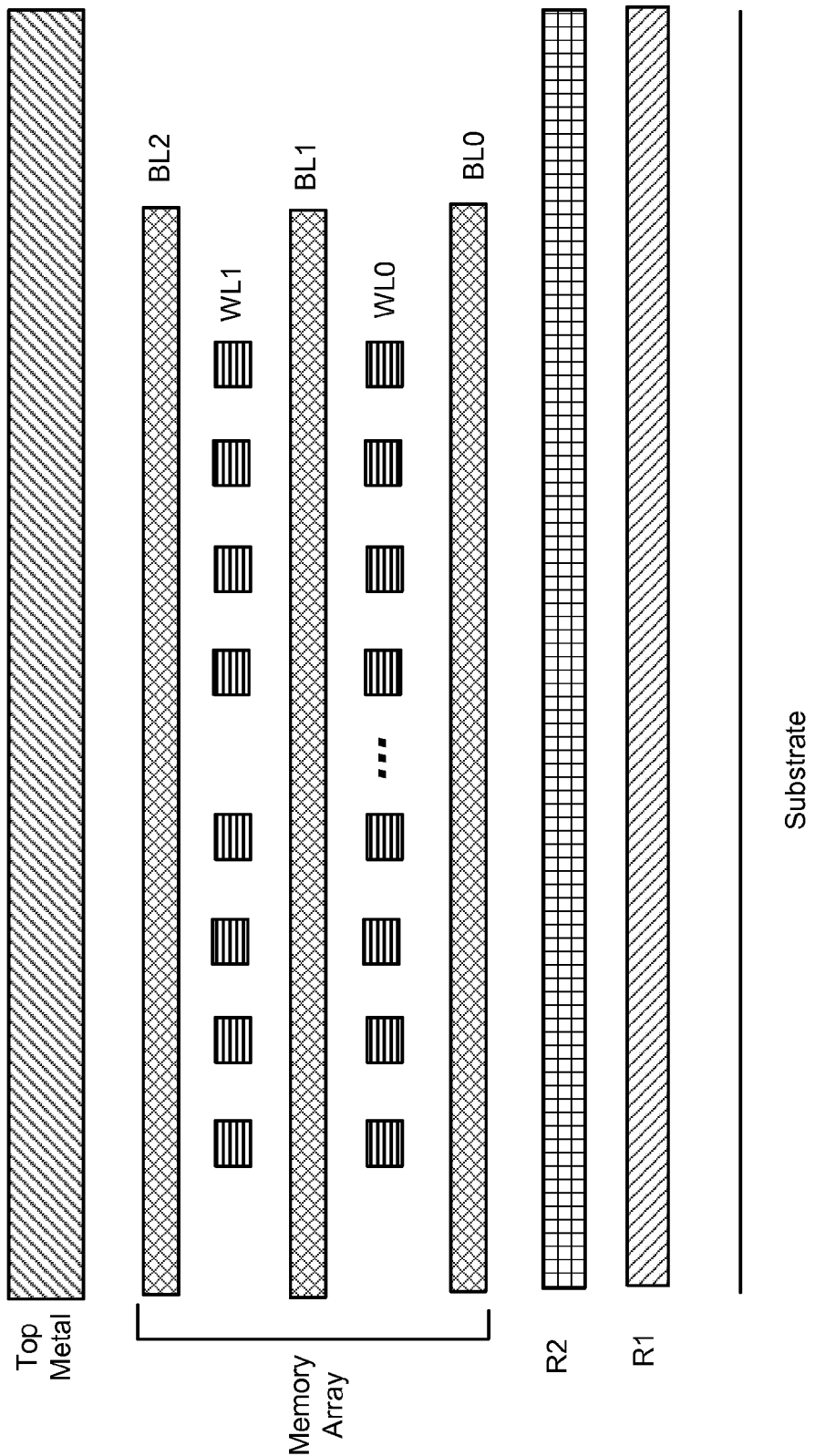
FIG. 3 depicts a subset of the layers of one embodiment of a three-dimensional memory.

As mentioned above, FIG. 2 shows a portion of a monolithic three-dimensional memory array. As can be seen, the bit lines 206 and 210 are arranged in a first direction and the word lines 208 are arranged in a second direction perpendicular to the bit lines. In a memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above the supporting circuitry. FIG. 3, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 3 shows two metal layers R1 and R2 used for routing; however, other embodiments can include more or less than two metal layers. In one example, these metal layers R1 and R2 are formed of Tungsten (about 1.5 ohm/squre), which has both a relatively high resistance and high capacitance.

Positioned above the memory array can be one or more metal layers used for routing signals between different components of the memory system. FIG. 3 shows one such metal layer above the memory array, labeled as the Top Metal layer. In one example, the top metal layer is formed of aluminum or copper (about 0.05 ohm/squre), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 4:
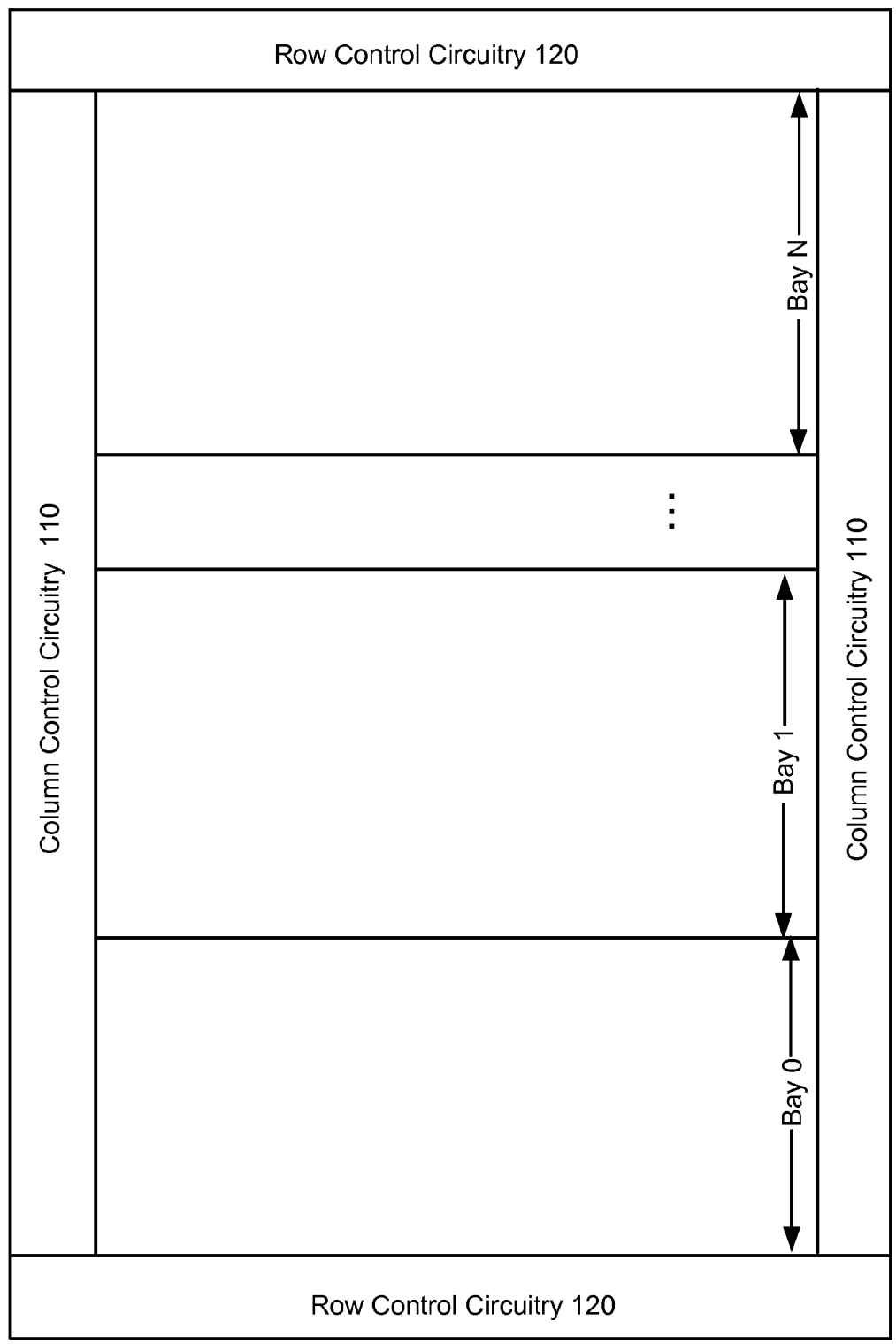
FIG. 4 depicts a logical view of one embodiment of a memory array.
Figure 5:
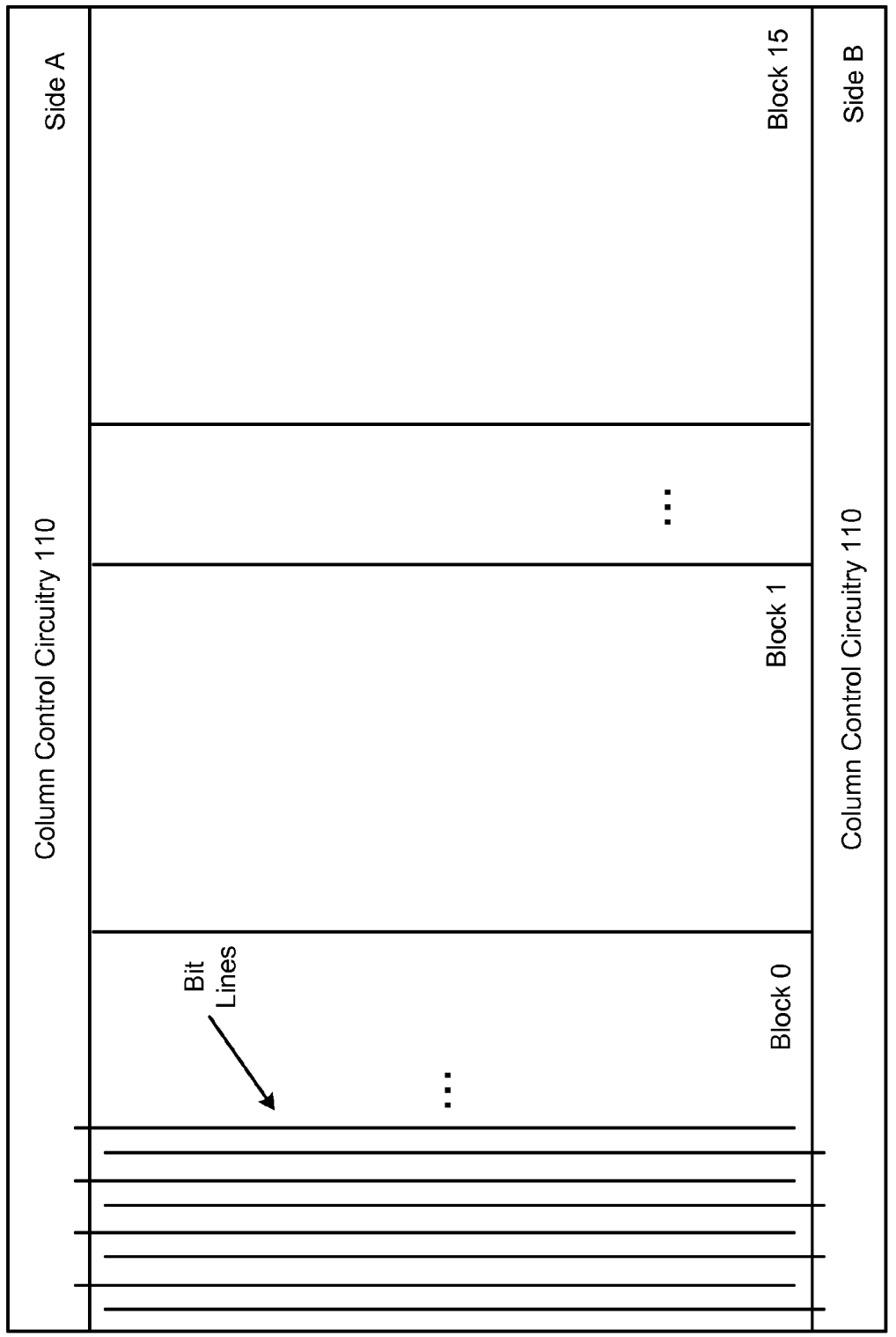
FIG. 5 depicts a logical view of one embodiment of a bay in a memory array.

Integrated circuits incorporating a memory array, such as memory array 102, usually subdivide the array into a number of sub-arrays or blocks. Blocks can be grouped together into bays that contain, for example, 16, 32, or a different number of blocks. FIG. 4 shows a logical view of memory array 102 divided into bays (e.g., Bay 0, Bay 1, ... Bay N). The number of bays can be different for different implementations. Some embodiments may use only one bay. FIG. 5 shows one bay (e.g., Bay 0) divided into blocks (Block 0-Block 15). In one embodiment, there are 16 blocks in a bay. However, other embodiments can use different numbers of blocks.

As frequently used, a sub-array or block is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 5 shows a subset of the Bit Lines for Block 0. Looking back at FIG. 3, it can be seen that the substrate is wider than the memory array; therefore, portions of the Column Control Circuitry 110 can protrude out from under the memory array to facilitate connections using zias and vias to R1, R2, Top Metal, and the bit lines. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. These two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process.

In one embodiment, there are two sense amplifiers located below each block, for example, on the surface of the substrate. One of the two sense amplifiers are for bit lines that connect to Column Control Circuitry 110 on side A and the other sense amplifier is for bit lines that connect to Column Control Circuitry 110 on side B. In the embodiment that includes 16 blocks in a bay, there are 32 sense amplifiers for a bay with sixteen for each side (side A and side B). In one embodiment, one property of a bay is that all of the blocks in the bay share the same 32 sense amplifiers. That means that 32 memory cells in a bay can be simultaneously selected for programming or reading. Thus, the memory system must include circuits for selecting the 32 memory cells and lines for routing signals between the 32 selected memory cells and the sense amplifiers.

In previous systems, global routing lines for routing signals between the 32 selected memory cells and the sense amplifiers were implemented in metals layers R1 or R2, which have a relatively large resistance and capacitance. To reduce overall resistance and capacitance, some previous designs have implemented half of the global routing lines for routing signals between the 32 selected memory cells and the sense amplifiers in R1 (or R2) and the other half of the global routing lines for routing signals between the 32 selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, etc. blocks. Selection circuits are used to connect the local data lines to the appropriate bit lines. Sense amplifier outputs are provided to global data lines across all bays. Selection circuits are used to connect the global data lines to the appropriate local data lines.

Figure 6:
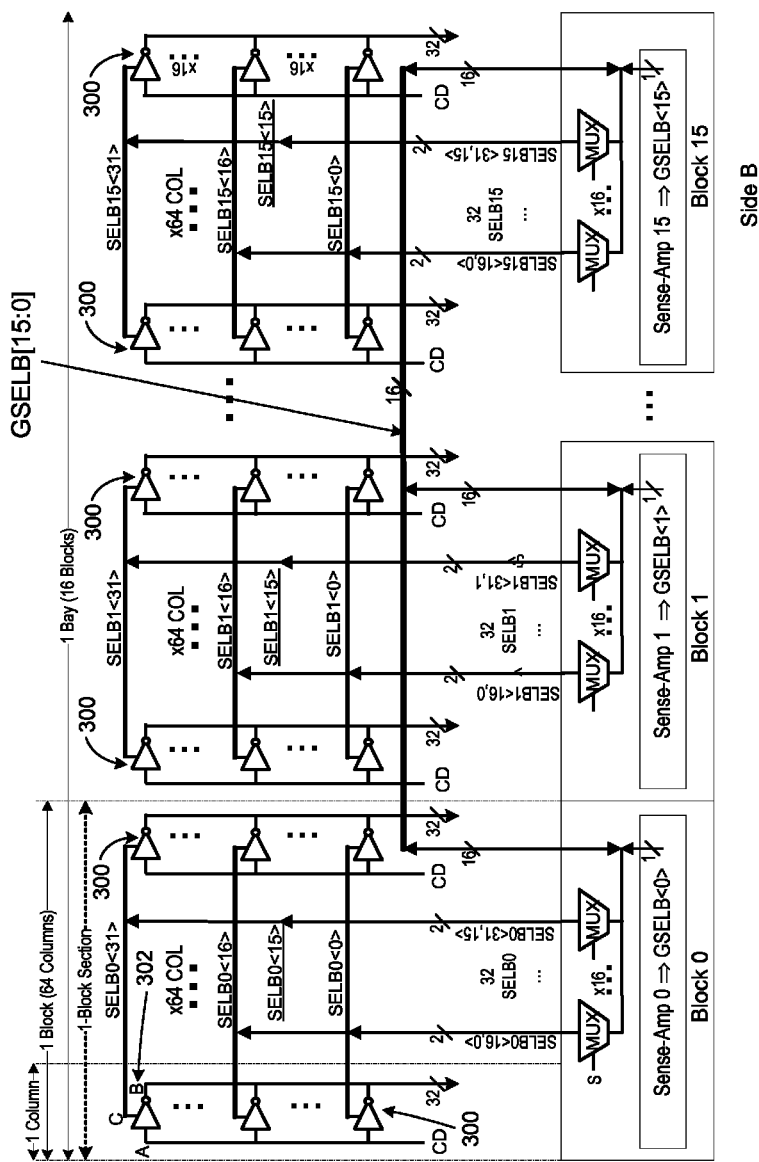
FIG. 6 is a schematic diagram of one embodiment of the data lines and selection circuits for connecting bit lines to the column control circuitry via the data lines.

FIG. 6 is a schematic diagram that depicts a portion of the routing signals and selection circuits for one embodiment of Column Control Circuitry 110 that implements a sectional data line scheme. In this embodiment, there are 16 blocks in a bay. Depicted are portions of three blocks: Block 0, Block 1 and block 15. Each block has 64 columns of selection circuits 300 for electrically connecting bit lines to sense amplifiers on one side of the array (e.g. side A of FIG. 5) and 64 columns of selection circuits for connecting to bit lines to sense amplifiers on the other side of the array (e.g. side B of FIG. 5). FIG. 6 only shows the 64 columns of selection circuits 300 for connecting to side B. Each block, therefore, has 64 columns× 32 bit lines×2 (top and bottom)=4096 bit lines for every block. In one embodiment, the three dimensional memory array includes four layers, with 1024 bit lines per layers. Other arrangements of the decoding circuits, bit lines and layers can also be used.

In the embodiment of FIG. 6, each block has its own set of local data lines. For example, block 0 includes SELB0<31:0>, block 1 includes SELB1<31:0>, ... block 15 includes SELB15<31:0>. The local data lines SELB0<31:0>, SELB1<31:0>, ... SELB15<31:0> are implemented in metal layer R1 under their respective block, and only run the width of the respective block. Selection circuits 300 for a particular column are used to selectively connect the 32 bit lines for that same column to 32 respective local data lines (SELB0<31:0>, SELB1<31:0>, . . . or SELB15<31:0>). As can be seen from FIG. 6, each of the selection circuits 300 receives a selection signal CD from column decoders 112 and a bit line connection from one of the 32 bit lines associated with the column. Based on the selection input from column decoder 112, the selection circuit 300 will connect or disconnect the bit line to a respective one of the local data lines (e.g., SELB0<31:0>, SELB1<31:0>, SELB15<31:0>).

Figure 7:
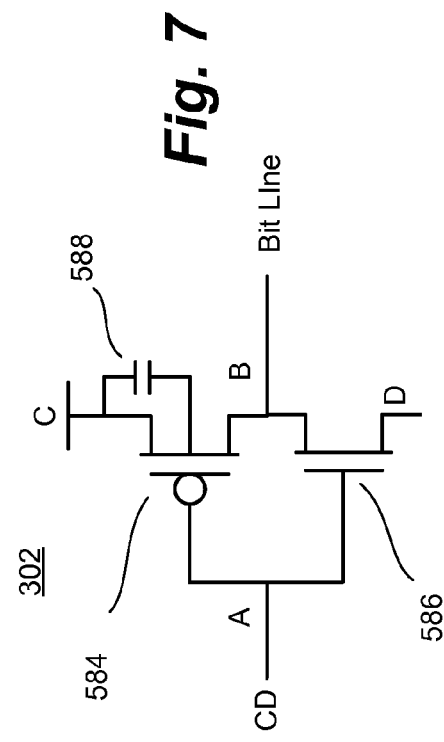
FIG. 7 is a schematic diagram of one embodiment of a selection circuit.

FIG. 7 is a schematic diagram showing the details of the selection circuits 300. For example purposes, one of selection circuits 300 has been individually labeled by reference number 302 in FIG. 6. Selection circuit 302 includes terminals A, B and C. The schematic diagram of FIG. 7 also shows terminals A, B and C. Terminal A is connected to column decoder 112 so that column decoder 112 can send a selection signal CD to control selection circuit 302. Terminal B is connected to a respective bit line. Terminal C is connected to a respective local data line (e.g., one of SELB0<31:0>, SELB1<31:0>, . . . or SELB15<31:0>). FIG. 7 also shows a terminal D, which is a global line for unselected bit lines. For ease of reading, FIG. 6 does not show the connection to all of the terminal D's of the selection circuits 300; however, one skilled in the art would understand that all of the terminal D's are connected to a common unselected bit line signal value. The selection circuits electrically connect a bit line to a local data line so that the bit line can electrically communicate with the local data line. When the selection circuit is configured to not electrically connect a bit line to a local data line, then the bit line cannot communicate with the local data line despite that both the bit line and data line are still physically connected to the selection circuit.

The selection circuits each include two connected transistors 584 and 586 and capacitor 588. Capacitor 588 is not an actual physical capacitor in the circuit. Instead, capacitor 588 represents the source-to-well parasitic capacitance. Terminal A connects the column decoder 112 to the gates of transistors 584 and 586. Based on the signal at terminal A, the bit line at Terminal B will be in communication with the respective local data line (e.g., one of SELB0<31:0>, SELB1<31:0>, . . . or SELB15<31:0>) at Terminal C or the unselected bit line signal at terminal D. Each of the selection circuits 300 will be fabricated on the surface of the substrate with connections to bit lines using zias and connections to column decoders 112, local data lines and unselected bit line signals using metal layers R1 and/or R2.

Looking back at FIG. 6, column decoders 112 choose one column and send that chosen column a selection indication on the appropriate selection signal CD so that the chosen column connects the respective 32 bit lines to the local data lines (SELB0<31:0>, SELB1<31:0>, . . . or SELB15<31:0>). Each block has its own set of sixteen 2:1 multiplexers (MUX) that are associated with the block and located on the substrate below the block. Each set of 32 local data lines (SELB0<31:0>, SELB1<31:0>, . . . or SELB15<31:0>) are connected to a set of sixteen 2:1 multiplexers (MUX) for that respective block. For example, in block 0 the first multiplexer receives SELB0<0> and SELB0<16>, the second multiplexer receives SELB0<1> and SELB0<17>, . . . the sixteenth multiplexer receives SELB0<15> and SELB0<31>. Each of the multiplexers receives a selection signal (e.g., signal S) from column decoders 112 so that 16 of the 32 local data lines are selected. In one embodiment, the same selection signal S is provided to all of the multiplexers (MUX) for a block (or bay) so that either (for example) SELB0<15:0> are selected or SELB0<16:31> are selected.

In one embodiment, the multiplexers include the ability to bias the unselected SELB.

The sixteen selected local data lines are connected to global data lines GSELB[15:0]. For example, SELB0<0> is connected to GSELB[0], SELB0<1> is connected to GSELB[1], etc. or SELB0<16> is connected to GSELB[0], SELB0<17> is connected to GSELB[1], etc. The global data lines GSELB[15:0] are implemented in Top Metal and connections between global data lines GSELB[15:0] and multiplexers (MUX) are made using zias (or vias). The global data lines GSELB[15:0] run across the entire Bay, with each BAY having its own set of global data lines. To reduce coupling between global data lines, various forms of Top Metal isolation can be used.

Each of the global data lines GSELB[15:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], . . . and the output Sense-Amp15 of the sense amplifier located underneath block 15 is connected to GSELB[15]. Thus, the output of a particular sense amplifier is connected to a global data line, then to a local data line by way of a multiplexer, and then to a bit line by way of a selection circuit. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced by almost 1/16 (previously all transistors in a bay were connected, now only the ones in a block). The total parasitic capacitance of the bit line drivers (source-to-well parasitic cap) is reduced by having a sectional data-line, by reducing number of bit line drives for each data-line (SELB).

As mentioned above, FIG. 6 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 6. Therefore, a selected block is associated with 64 selected bit lines that are connected to 64 local data lines, for which 32 multiplexers choose 32 local data lines to connect to 32 global data lines. The 32 global data lines are connected to 32 sense amplifiers associated with that particular bay.

The choice of selecting 16 blocks in a bay, 64 bit lines in a column, using 64 local data lines, and 32 global data lines is for one set of embodiments. In other embodiments, different numbers of each item can be used. Additionally, the number of local data lines can be non-binary (like e.g., 48 or 96).

Figure 8:
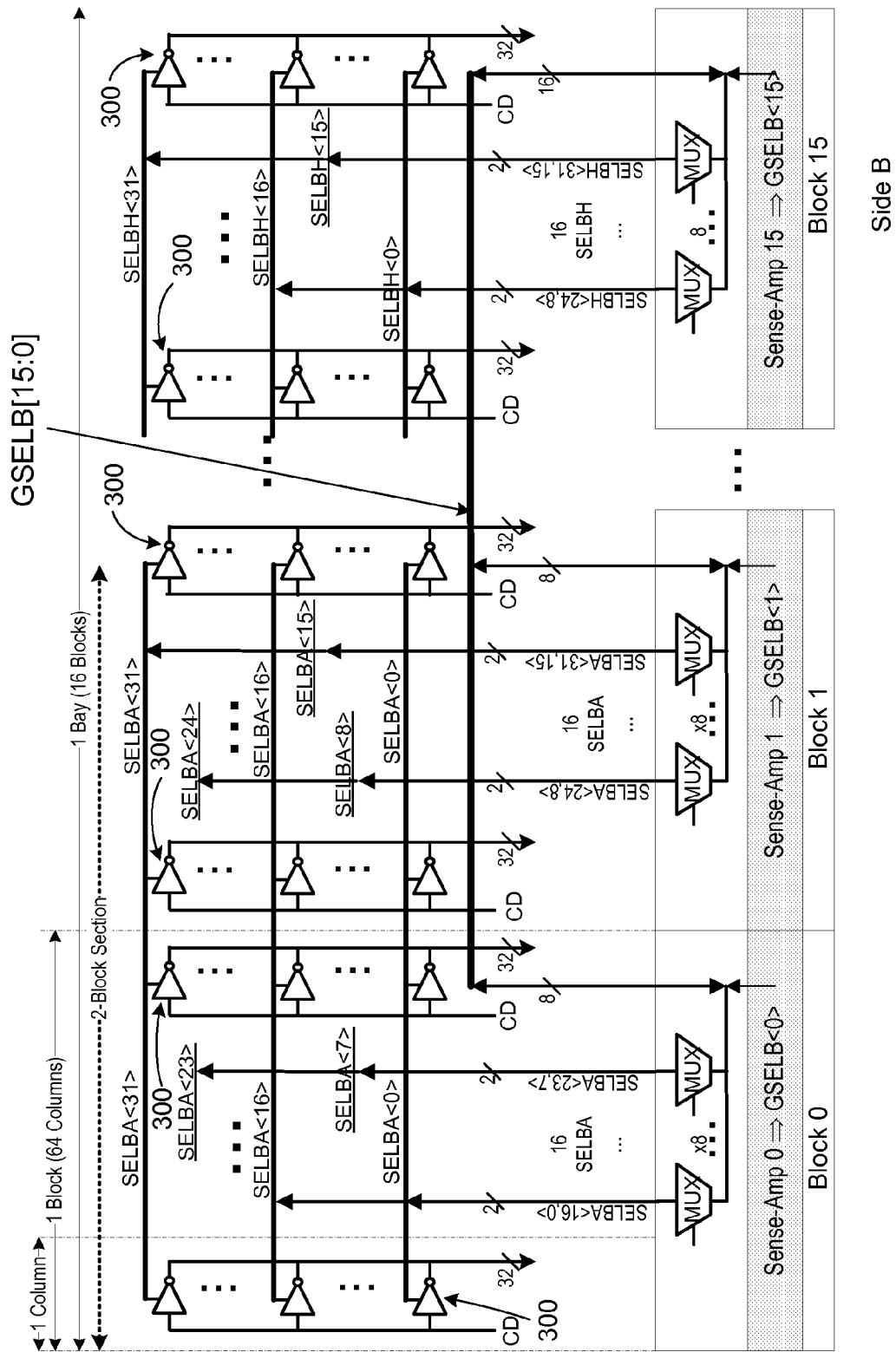
FIG. 8 is a schematic diagram of one embodiment of the data lines and selection circuits for connecting bit lines to the column control circuitry via the data lines.
Figure 9:
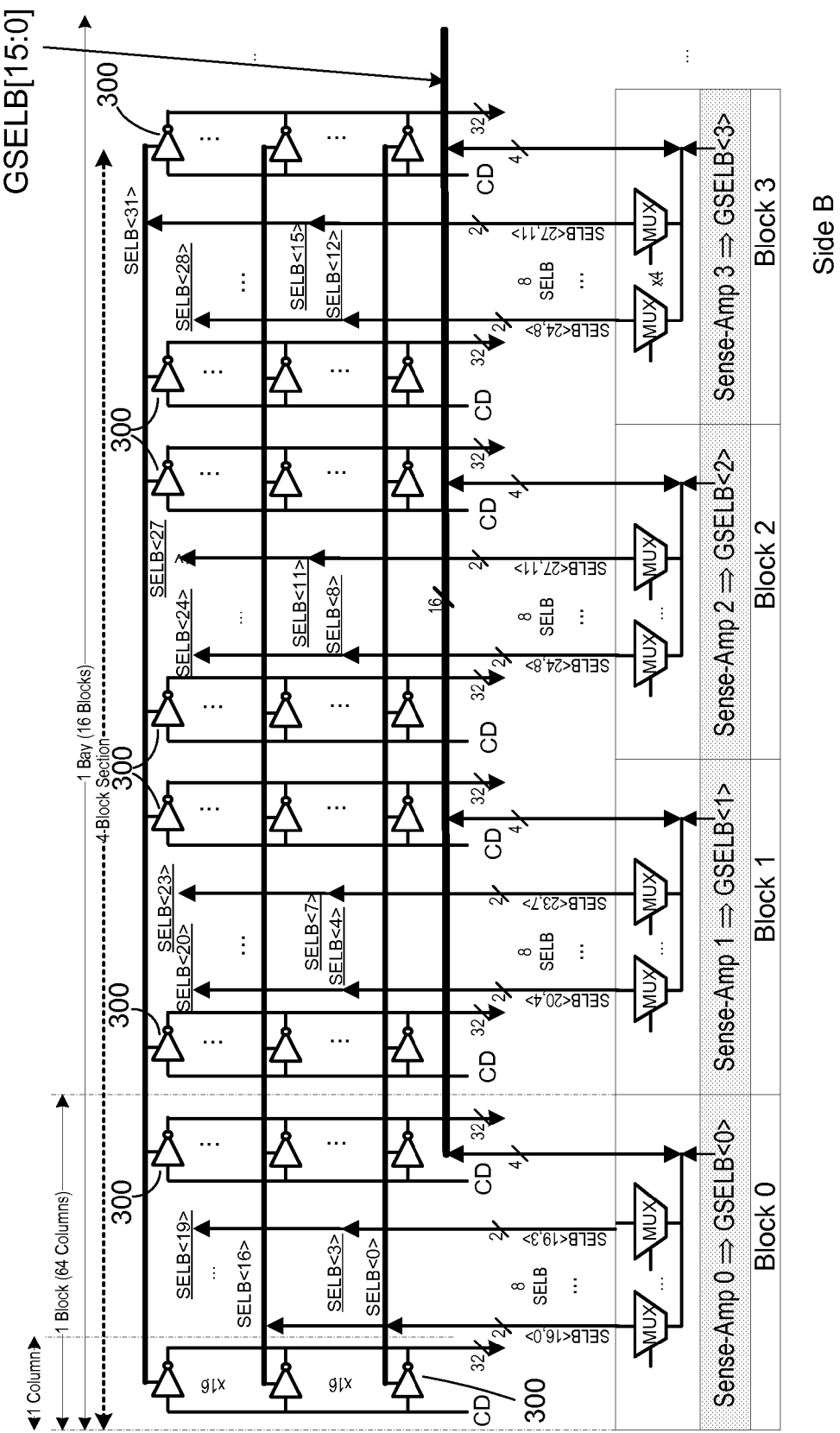
FIG. 9 is a schematic diagram of one embodiment of the data lines and selection circuits for connecting bit lines to the column control circuitry via the data lines.

If the memory system is being implemented in an integrated circuit that is limited in space for the multiplexers (MUX) and the extra signal lines, then multiple blocks can share a set of local data lines. FIG. 8 provides an example of an embodiment where sets of local data lines are each shared by two blocks. FIG. 9 provides an example of another embodiment where sets of local data lines are each shared by four blocks. In other embodiments, other numbers of blocks can share a set of local data lines.

FIG. 8 shows sixteen blocks that comprise a bay. Like FIG. 6, FIG. 8 only shows the routing signals and selection circuits for connection to one side (e.g. side B). In the embodiment of FIG. 8, a set of data lines are shared by two blocks. For example, SELBA<31:0> are shared by block 0 and block 1, SELBB<31:0> (not depicted) are shared by block 2 and block 3, . . . and SELBH<31:0> are shared by block 14 and block 15. Each set of local data lines are implemented in metal layer R1 and/or metal layer R2 in the space below the associated blocks. For example, SELBA<31:0> are implemented below block 0 and block 1. FIG. 8 depicts 64 columns for each block, with each column including 32 selection circuits 300 for selecting 32 bit lines to be connected to the local data lines.

The local data lines are connected to sixteen multiplexers (MUX). Eight of the sixteen multiplexers are associated with and located below a first of the two blocks and the other eight multiplexers are associated with and located below the second of the two blocks. For example, sixteen of the SELBA lines are connected to multiplexers (MUX) bellow block 0 and sixteen of the SELBA lines are connected to multiplexers (MUX) bellow block 1. In response to a selection signal from column decoders 112, sixteen of the thirty two local data lines are connected to the global data lines GSELB[15:0].

Each of the global data lines GSELB[15:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], . . . and the output Sense-Amp15 of the sense amplifier located underneath block 15 is connected to GSELB[15]. Thus, the output of a particular sense amplifier is connected to a global data line, then to a local data line by way of a multiplexer, and then to a bit line by way of a selection circuit.

As mentioned above, FIG. 8 only shows the connection paths to sense amplifiers on one side (e.g., side B) of the blocks. Thus, there is another set of local data lines for each pair of blocks, another set of global data lines for each bay and another set of sense amplifiers for each bay in addition to that which is depicted for FIG. 8.

By having two blocks share a set of local data lines, the number of multiplexers and the number of signal lines to and from the multiplexers is reduced.

FIG. 9 depicts an embodiment where four blocks share a set of local data lines. Therefore, each bay (which includes sixteen blocks) would have four sets of local data lines that can be selectively connected to one set of global data lines for that bay. For ease of viewing, FIG. 9 only depicts four blocks: block 0, block 1, block 2 and block 3, all of which share local data lines SELB<0:32>. The local data lines SELB<0:32> are implemented in metal layer R1 or metal layer R2 underneath blocks 0-3.

Like FIG. 6, FIG. 9 only shows the routing signals and selection circuits for connection to one side (e.g. side B). FIG. 9 depicts 64 columns for each block, with each column including 32 selection circuits 300 for selecting 32 bit lines to be connected to the local data lines SELB.

The local data lines are connected to sixteen multiplexers (MUX). Four of the sixteen multiplexers are associated with and located below each of the four blocks. For example, eight of the SELB lines are connected to multiplexers (MUX) below block 0, eight of the SELB lines are connected to multiplexers (MUX) bellow block 1, eight of the SELB lines are connected to multiplexers (MUX) bellow block 2 and eight of the SELB lines are connected to multiplexers (MUX) bellow block 3. In response to a selection signal from column decoders 112, sixteen of the thirty two local data lines SELB<31:0> are connected to the global data lines GSELB[15:0].

Each of the global data lines GSELB[15:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], . . . and the output Sense-Amp15 of the sense amplifier located underneath block 15 is connected to GSELB[15]. Thus, the output of a particular sense amplifier is connected to a global data line, then to a local data line by way of a multiplexer, and then to a bit line by way of a selection circuit.

As mentioned above, FIG. 9 only shows the connection paths to sense amplifiers on one side (e.g., side B) of the blocks. Thus, there is another set of local data lines for each group of blocks, another set of global data lines for each bay, and another set of sense amplifiers for each bay in addition to that which is depicted for FIG. 9. By having four blocks share a set of local data lines, the number of multiplexers and the number of signal lines to and from the multiplexers is reduced. In other embodiments, eight, sixteen or other numbers of blocks can share a set of local data lines.

For some embodiments of two-terminal re-writable memories, the sense amplifier is sensing the selected memory cell during read operations by biasing the selected bit line to a higher voltage (e.g., 1.5v). The selected word line is biased to lower voltage (e.g., 0v). To avoid sensing leakage current from the selected bit line to many unselected word-lines, the unselected word lines are biased at the same voltage as the selected bit-lines (e.g., 1.5v). To avoid leakage current from the unselected bit lines to the selected word line, the unselected bit lines can be biased at the same voltage as selected bit-lines (e.g. 0v).

In program operations (SET/RESET/FORM), the memory array is also forward biased, which is similar to a read operation. The main difference is the voltage range. The selected bit line is required to be biased at the highest voltage: VWR (e.g., 8v in "FORM"). The selected word-line is at VSS. All unselected bit lines are biased at VUB (e.g., 0.7v). All un-selected word-line are biased at VUX (e.g., 7.5v in "FORM"). The voltage range for SET and RESET operations is 2-5 volts. In an embodiment that uses reversible resistance-switching material in a data storage element, the SET operation puts the reversible resistance-switching material in a low resistance state, the RESET operation puts the reversible resistance-switching material in a high resistance state, and the FORM operation is the first SET operation (which requires a higher voltage than subsequent SET operations). Other schemes can also be used.

In order to reduce the maximum voltage requirement for the on-chip charge pumps, the bit line driver circuits are designed to pass selected bit line voltages through a PMOS transistor, as depicted in FIG. 7 (see transistor 584). It is proposed that the voltage driven during a read operation be lower than in the past. This creates an issue because the PMOS transistor (e.g., transistor 584 of FIG. 7) at the selected bit line driver (e.g. selection circuit) cannot deliver enough READ current (e.g. 1 uA) with the gate biased at VSS (0v). Another disadvantage of connecting the local data lines to the selected bit-line is the noise of N-well biased voltage (VUX) coupling to the sense amplifier output node. There is more than 4K of unselected bit-line drivers, which may couple enough noise (from VUX) to the sense amplifier output to cause a sensing error during read operations. This coupling happens through the parasitic capacitance of the bit line driver.

Figure 10:
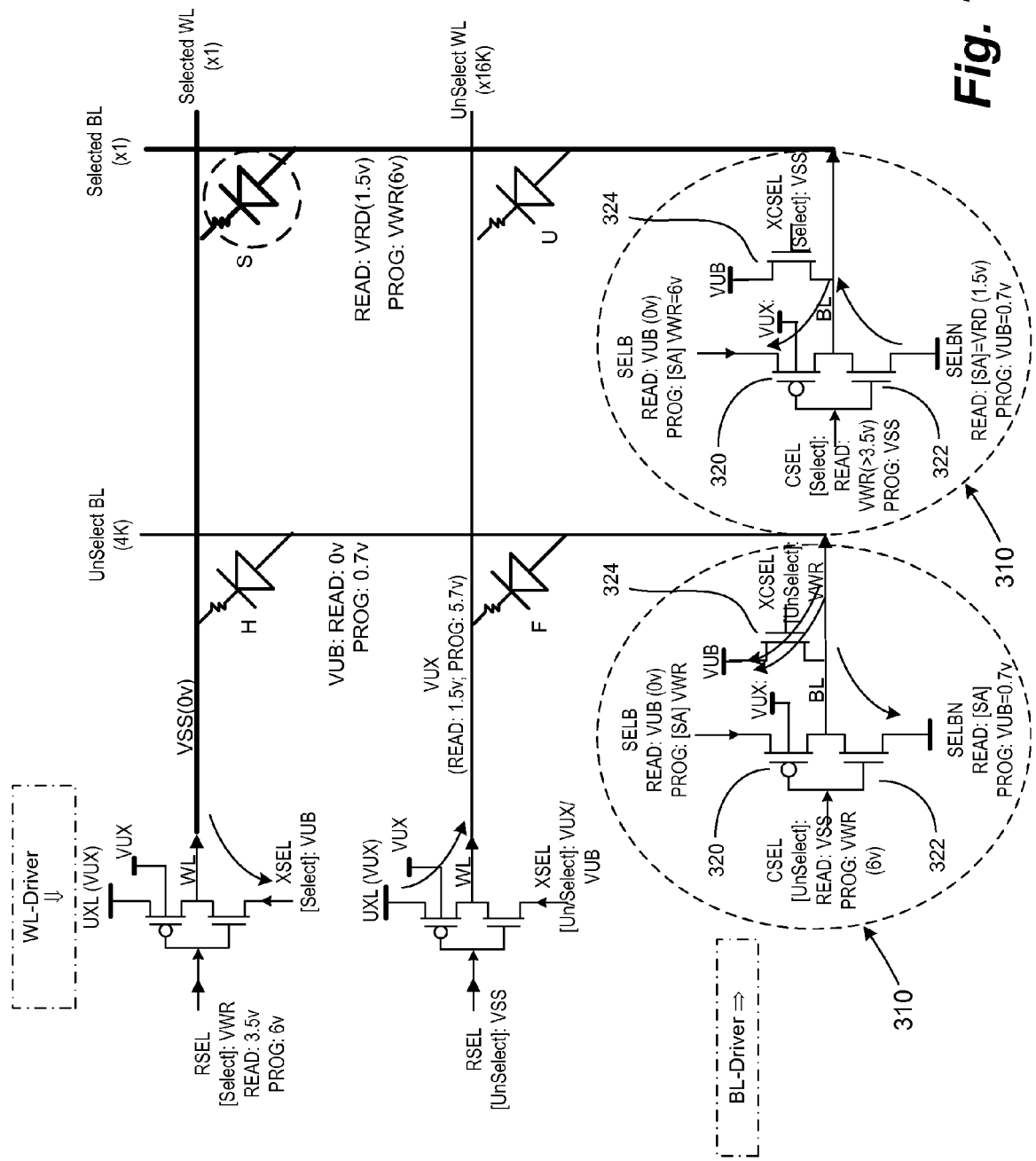
FIG. 10 is a schematic diagram of one embodiment of a portion of the memory array and the selection circuits for connecting the bit lines to various voltage sources.

For those embodiments where the above-described issue exists, the circuit of FIG. 10 provides a solution. FIG. 10 shows four memory cells H, F, S, U (of the many memory cells) from a three dimensional memory array. In the example of FIG. 10, memory cells S is selected for a memory operation (read or program). FIG. 10 shows two word line drivers (WL-Drivers) and two bit line drivers (BL-Drivers).

The embodiment of FIG. 10 provides bit line driver/selection circuit 310 to replace selection circuit 300 described above. Selection circuit 310 connects the relevant selected bit line to a first local data line SELB through a PMOS transistor 320 during a programming operation (PROG) and connects the relevant selected bit line to a second local data line SELBN through a NMOS transistor 322 during a read operation (READ).

An extra NMOS transistor 324 is added to the selection circuit 310 between the bit line and the unselected bit line voltage. The gate signal XCSEL of transistor 324 is the reverse logic of PMOS transistor 320 during a read operation. In the selection circuit 310 for the selected bit line, CSEL (gate of transistors 320 and 322) is high (e.g., 3.5 v) and the sense amplifier output (SELBN) is connected to the selected bit line through NMOS transistor 322. In a selection circuit 310 for an unselected bit line, CSEL is low (e.g., 0v) and XCEL is high; therefore, the unselected voltage power (VUB=0v) can be delivered to the unselected bit line though NMOS transistor 324.

During program operations, the maximum voltage (e.g., 2-8 v) should be able to be passed to the selected bit line. The sense amplifier output is connected to the source of the PMOS transistor 320 (labeled SELB). When the selection circuit 310 is selected (CSEL=VSS), the sense amplifier output voltage VWR (e.g., 6 volts) is applied on the selected bit line through the PMOS transistor 320. If the bit line is unselected (CSL=VWR) the bit line is pulled down (to approximately 0.7 volts) through NMOS transistor 322 with CSEL at 6v and XCSEL at 6v.

Figure 11:
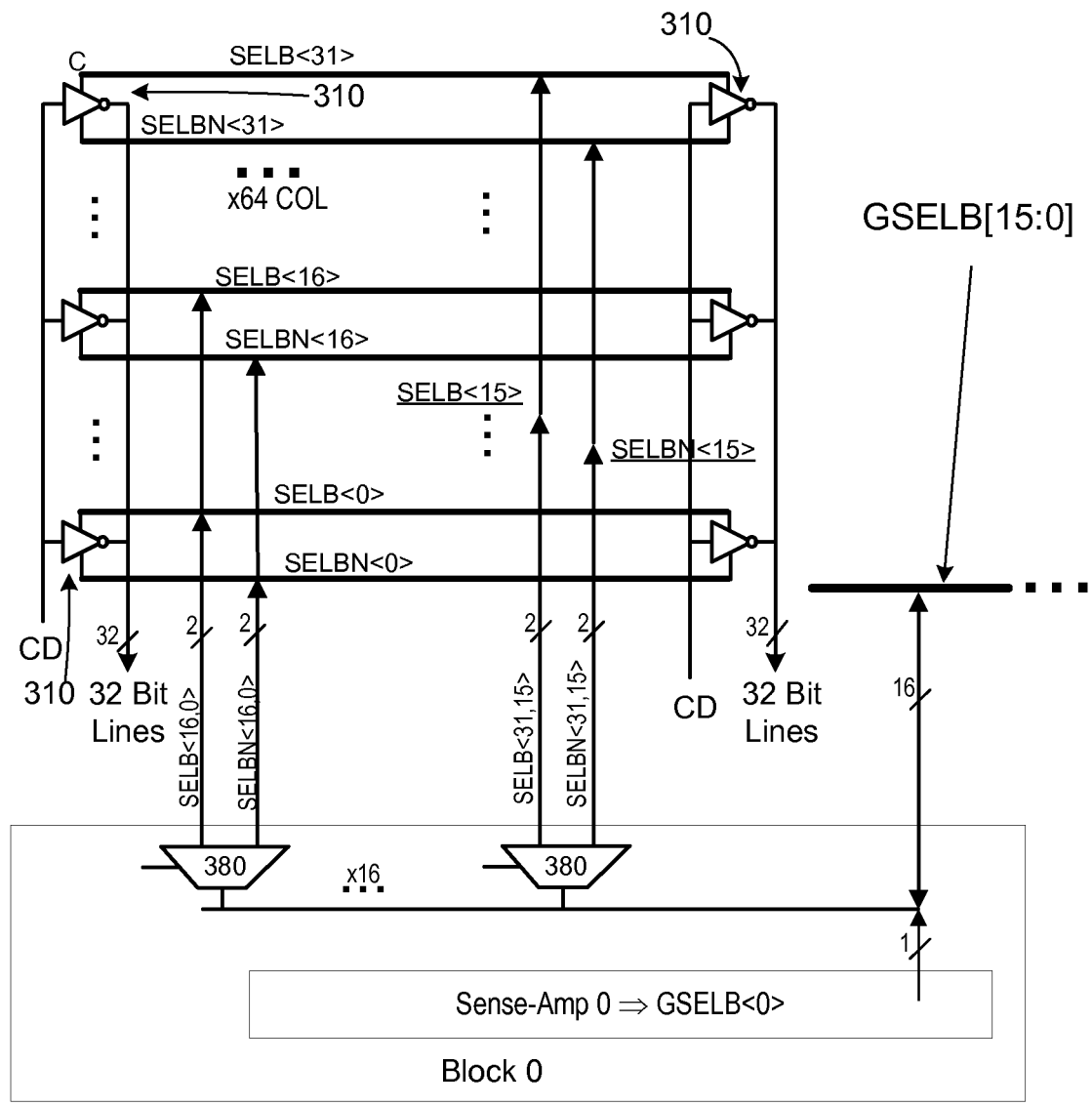
FIG. 11 is a schematic diagram of one embodiment of the data lines and selection circuits for connecting bit lines to the column control circuitry via the data lines.

FIG. 11 depicts the routing signals and selection circuits for one block of a bay that has been adapted to utilize the scheme depicted in FIG. 10. Instead of each block (or pair of blocks, or other group of blocks) having one set of local data lines SELB, each block (or pair of blocks, or other group of blocks) is provided with two sets of local data lines: SELB and SELBN. For example, block 0 depicted in FIG. 11 has local data lines SELB<31:0> and SELBN<31:0>. The set of data lines SELB<31:0> are used to drive voltages for selected bit lines during programming operations. The set of data lines SELBN<31:0> are used to drive voltages for selected bit lines during read operations.

On the substrate, below each block, are a set of sixteen 4:1 multiplexers 380. Two of the inputs to each multiplexer 380 are two of the local data lines SELB and two other inputs to each multiplexer 380 are two of the local data lines SELBN. For example, a first (leftmost) multiplexer depicted in FIG. 11 receives SELB<0>, SELB<16>, SELBN<0>, and SELBN<16>. Each multiplexer 320 receives a selection signal from column control circuitry 110 to selectively connect one of the four local data lines to the associated global data lines. Sixteen of the sixty four local data lines provided to the multiplexers 380 are connected to GSELB[15:0] by multiplexers 380. In one embodiment, the selection signal from column control circuitry 110 causes the set of sixteen multiplexers to select either SELB<15:0>, SELB<31:16>, SELBN<15:0> or SELBN<31:16>.

FIG. 11 only shows the connection paths to sense amplifiers on one side (e.g., side B) of block 0. Thus, there are other sets of local data lines for each block, another set of global data lines for each bay, and another set of sense amplifiers for each bay in addition to that which is depicted for FIG. 11.

Figure 12:
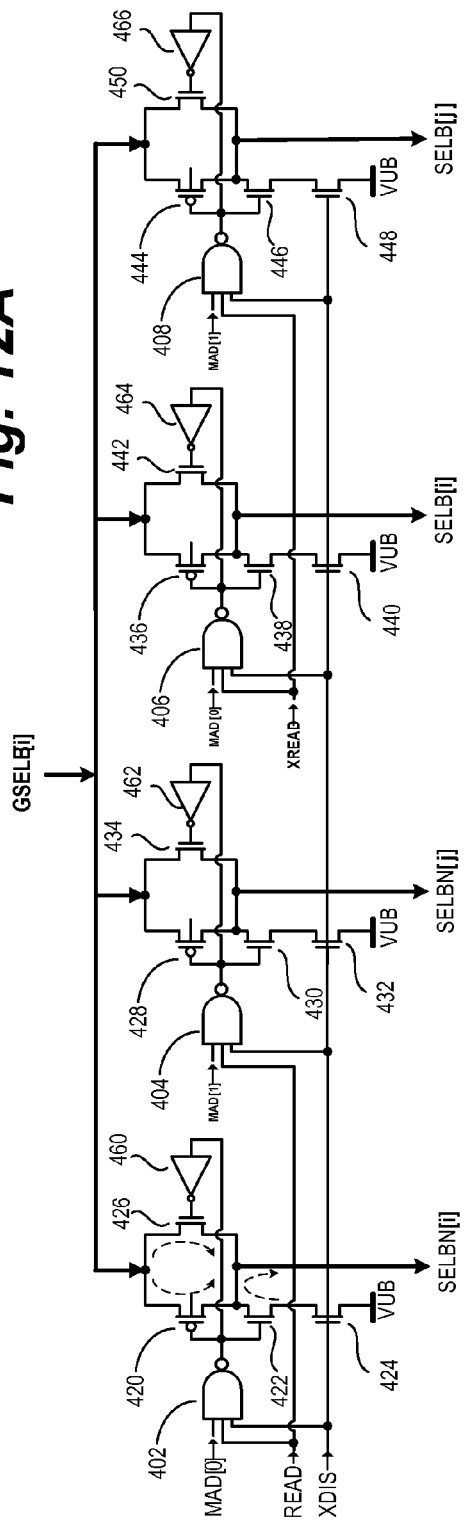
FIG. 12A is a schematic of one embodiment of a multiplexer.
FIG. 12B is a table explaining the operation of the multiplexer of FIG. 12A.

FIG. 12A is a schematic of one example of multiplexer 380. The schematic shows four NAND gates (402, 404, 406 and 408), sixteen transistors (420, 422, 424, 426, 428, 430, 432, 434, 436, 438, 440, 442, 444, 446, 448 and 450) and four inverters (460, 462, 464 and 466). FIG. 12B is a table explaining the operation of the circuit of FIG. 12A. Based on the signals at MAD[1:0], READ, XREAD, and XDIS, one of the four local data lines (SELB[i], SELB[j], SELBN[i] and SELBN[j]) can be selectively connected to the global data lines GSELB[i].

FIG. 12A shows NAND gate 402 receiving MAD[0], READ and XDIS and providing an output to transistor 420, transistor 422 and inverter 460. The output of inverter 460 is provided to transistor 426. Transistor 420 is also connected to GSELB[i] and SELBN[i]. Transistor 422 is also connected to SELBN[i] and transistor 424. Transistor 424 is also connected to VUB and XDIS. Transistor 426 is also connected to SELBN[i] and GSELB[i].

NAND gate 404 receives MAD[1], READ and XDIS and provides an output to transistor 428, transistor 430 and inverter 462. The output of inverter 462 is provided to transistor 434. Transistor 428 is also connected to GSELB[i] and SELBN[j]. Transistor 430 is also connected to SELBN[j] and transistor 432. Transistor 432 is also connected to VUB and XDIS. Transistor 434 is also connected to SELBN[j] and GSELB[i].

NAND gate 406 receives MAD[0], XREAD and XDIS and provides an output to transistor 436, transistor 438 and inverter 464. The output of inverter 464 is provided to transistor 42. Transistor 436 is also connected to GSELB[i] and SELB[i]. Transistor 438 is also connected to SELB[i] and transistor 440. Transistor 440 is also connected to VUB and XDIS. Transistor 442 is also connected to SELB[i] and GSELB[i].

NAND gate 408 receives MAD[1], XREAD and XDIS and provides an output to transistor 444, transistor 446 and inverter 466. The output of inverter 466 is provided to transistor 450. Transistor 444 is also connected to GSELB[i] and SELB[j]. Transistor 446 is also connected to SELB[j] and transistor 448. Transistor 448 is also connected to VUB and XDIS. Transistor 450 is also connected to SELBN[i] and GSELB[i].

Figure 13:
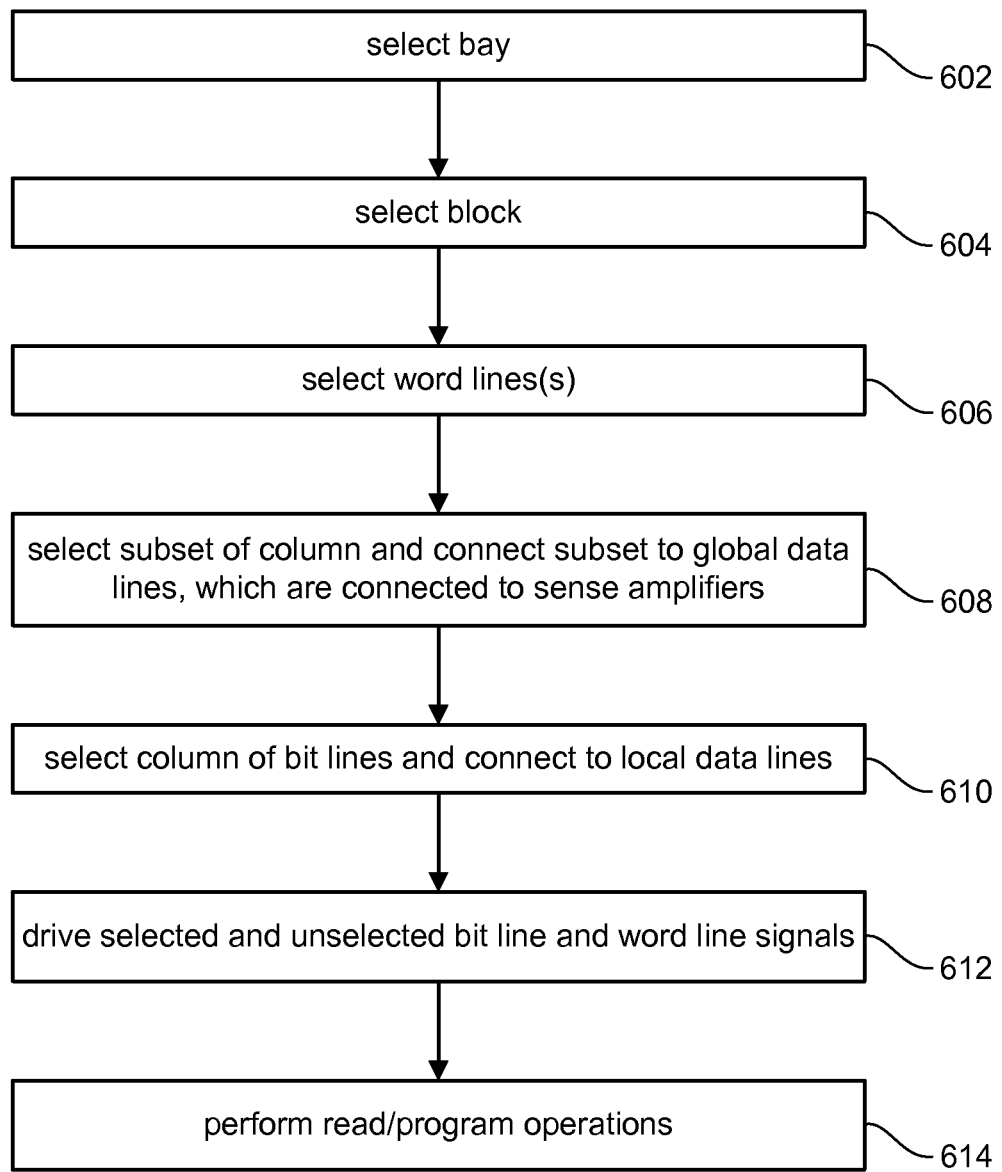
FIG. 13 is a flow chart describing one embodiment of a process for operating the data lines and selection circuits.

FIG. 13 is a flow chart describing the operation of the decoding and selection circuits described herein. In step 602, one bay is selected. In some embodiments, it may be possible to select more than one bay for simultaneous operations. In step 604, a block within the selected bay is selected for a memory operation. In step 606, the appropriate word line(s) is/are selected. In step 608, a subset of the local data lines is selected using the multiplexers described above and, thereby, connected to the global data lines for the bay. These global data lines are in communication with the appropriate sense amplifiers or other relevant circuits. In step 610, one of the columns within the selected block is selected and the bit lines for that column are connected to the appropriate set of local data lines, as discussed above. In step 612, the appropriate signals are driven on the selected bit lines, selected word line(s), unselected bit lines and unselected word lines. In step 614, the desired read or program operation(s) is/are performed, including reporting the results (data read or success/failure of programming) to a host device that is in communication with the memory system. These steps can also be performed in other orders. The exact scheme for programming or reading depends on the type of memory cell used. The technology described herein can be used with many different types of memory cells and memory architectures.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
   a plurality of non-volatile storage elements arranged in groups;
   bit lines in communication with the non-volatile storage elements;
   multiple sets of first local data lines, each group includes its own set of first local data lines;
   multiple sets of second local data lines, each group includes its own set of second local data lines;
   each set of first local data lines and each set of second local data lines being respectively outside the plurality of non-volatile storage elements for its respective group;
   a set of global data lines outside the plurality of non-volatile storage elements arranged in groups;
   first selection circuits, each group includes a different subset of the first selection circuits for selectively electrically connecting a subset of the bit lines to first local data lines for the respective group or second local data lines for the respective group;
   second selection circuits, the second selection circuits selectively electrically connect a subset of the set of first local data lines for the respective group or a subset of the set of second local data lines for the respective group to the global data lines; and
   control circuits in communication with the global data lines.

2. A non-volatile storage device according to claim 1, wherein:
   the plurality of non-volatile storage elements is a three-dimensional memory array that includes multiple layers of memory cells;
   the control circuits comprise column control circuitry that includes sense amplifiers;
   the first selection circuits include pmos transistors connected to nmos transistors;
   the second selection circuits includes 2:1 multiplexers; and
   the groups are blocks of memory cells that share a common set of sense amplifiers.

3. A non-volatile storage device according to claim 1, wherein:
   the second selection circuits are 4:1 multiplexers.

4. A non-volatile storage device according to claim 1, wherein:
   the first local data lines are positioned in at least one metal layer below the plurality of non-volatile storage elements; and
   the global data lines are positioned in at least one metal layer above the plurality of non-volatile storage elements.

5. The non-volatile storage device of claim 1, further comprising:
   a substrate, the control circuits in communication with the global data lines, being positioned on the substrate.

6. The non-volatile storage device of claim 5, further comprising:
   the sets of first local data lines and the sets of second local data lines being positioned between the substrate and the non-volatile storage elements.

7. The non-volatile storage device of claim 1, further comprising:
   the global data lines are positioned outside of the plurality of non-volatile storage elements arranged in groups.

8. The non-volatile storage device of claim 1 further comprising:
   the non-volatile storage elements are arranged in three-dimensions.

9. The non-volatile storage device of claim 1 further comprising:
   the non-volatile storage elements are arranged in a monolithic three-dimensional memory structure.

10. The non-volatile storage device of claim 1 further comprising:
    the non-volatile storage device includes a three-dimensional memory array including the non-volatile storage elements.

11. A method for operating a data storage system, comprising:
    selecting a first bay from a plurality of bays, the plurality of bays comprise an array of data storage elements, each bay includes a plurality of blocks of data storage elements and multiple sets of local data lines, each block includes a set of local data lines outside the data storage elements;
    selecting a block within the first bay, the selected block includes multiple columns of first selection circuits for selective communication of bit lines with the set of local data lines for the respective block, each of the first selection circuits are connected to a different bit line for the selected block, the bit lines for the selected block are in communication with data storage elements, and the selected block includes second selection circuits providing selective communication of the set of local data lines with a set of global data lines, the set of global data lines being outside the plurality of blocks of data storage elements;
    selecting a column of the selected block and using the first selection circuits of the selected column to provide selective communication between a subset of the set of local data lines for the respective block and a subset of bit lines connected to the first selection circuits of the selected column;
    selecting the subset of the local data lines for the respective block to communicate with the set of global data lines using the second selection circuits, the set of global data lines also connect to local data lines for other blocks; and
    performing a memory operation, using the global data lines, on data storage elements in communication with the selected subset of local data lines.

12. The method of claim 11, further comprising:
    driving signals on global data lines;
    selecting one or more word lines; and
    driving signals on the selected one or more word lines for the memory operation.

13. The method of claim 11, wherein:
    the local data lines are in at least one metal layer below the data storage elements; and
    the global data lines are in at least one metal layer above the data storage elements.

14. The method of claim 11 further comprising:
    the array of data storage elements is a three-dimensional memory array.

15. A method for operating a data storage system, comprising:
    selectively electrically connecting a subset of bit lines to a subset of a set of local data lines for selective communication of the subset of bit lines with the subset of the set of local data lines using a set of first selection circuits, the subset of bit lines are also in communication with a first subset of a plurality of data storage elements, the set of local data lines are positioned outside of the plurality of data storage elements;

selecting and electrically connecting the subset of the set of local data lines to a set of global data lines using a set of second selection circuits so that the subset of the set of local data lines are in communication with the set of global data lines, the global data lines are positioned outside of the plurality of data storage elements, the global data lines are connected to control circuitry, the global data lines are also connected to other sets of local data lines by the set of second selection circuits; and performing a memory operation on at least a portion of the first subset of data storage elements using the control circuitry.

16. The method of claim 15, wherein:

the plurality of data storage elements comprise a monolithic three-dimensional memory array;

the sets of local data lines are in at least one metal layer below the monolithic three-dimensional memory array; and the global data lines are in at least one metal layer above the monolithic three-dimensional memory array.

17. The method of claim 15, wherein:

the selectively electrically connecting the subset of bit lines to the subset of the set of local data lines comprises sending selection signals to the set of first selection circuits connected to the subset of bit lines and the set of local data lines; and the selecting and electrically connecting the subset of the set of local data lines to the set of global data lines using a set of second selection circuits comprises sending selection signals to multiplexer circuits connected to the set of local data lines and the set of global data lines.

18. The method of claim 15 further comprising:

the data storage elements are arranged in three-dimensions.

19. The method of claim 15 further comprising:

the data storage elements are arranged in a three-dimensional memory structure.

20. The method of claim 15 further comprising:

the data storage system includes a three-dimensional memory array including the data storage elements.

* * * * *